United States Patent
Kanaoka et al.

(10) Patent No.: US 9,920,423 B2
(45) Date of Patent: Mar. 20, 2018

(54) SURFACE-COATED CUTTING TOOL AND PROCESS FOR PRODUCING SAME

(71) Applicant: Sumitomo Electric Hardmetal Corp., Itami-shi (JP)

(72) Inventors: Hideaki Kanaoka, Sorachi-gun (JP); Anongsack Paseuth, Sorachi-gun (JP); Susumu Okuno, Sorachi-gun (JP); Takahiro Ichikawa, Sorachi-gun (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 60 days.

(21) Appl. No.: 14/769,378

(22) PCT Filed: Jan. 29, 2014

(86) PCT No.: PCT/JP2014/051908
§ 371 (c)(1),
(2) Date: Aug. 20, 2015

(87) PCT Pub. No.: WO2014/129273
PCT Pub. Date: Aug. 28, 2014

(65) Prior Publication Data
US 2016/0002772 A1    Jan. 7, 2016

(30) Foreign Application Priority Data

Feb. 21, 2013   (JP) .................................. 2013-032160
Oct. 2, 2013    (JP) .................................. 2013-207289

(51) Int. Cl.
| | | |
|---|---|---|
| C23C 16/38 | (2006.01) | |
| C23C 28/04 | (2006.01) | |
| B23B 27/14 | (2006.01) | |
| C23C 16/32 | (2006.01) | |
| C23C 16/34 | (2006.01) | |
| C23C 16/36 | (2006.01) | |
| C23C 16/40 | (2006.01) | |

(52) U.S. Cl.
CPC ........... C23C 16/38 (2013.01); B23B 27/148 (2013.01); C23C 16/32 (2013.01); C23C 16/34 (2013.01); C23C 16/36 (2013.01); C23C 16/403 (2013.01); C23C 28/042 (2013.01); C23C 28/044 (2013.01); B23B 2224/04 (2013.01); B23B 2224/32 (2013.01); B23B 2228/04 (2013.01); B23B 2228/10 (2013.01); B23B 2260/144 (2013.01)

(58) Field of Classification Search
USPC .......... 51/307, 309; 428/697, 698, 699, 701, 428/702, 704; 427/419.1, 419.2, 419.7, 427/348, 368
See application file for complete search history.

(56) References Cited

U.S. PATENT DOCUMENTS

| | | | | |
|---|---|---|---|---|
| 4,237,184 A | * | 12/1980 | Gonseth | ............... B23B 27/148 428/701 |
| 4,357,382 A | * | 11/1982 | Lambert | ............... C23C 30/005 428/698 |
| 6,007,909 A | * | 12/1999 | Rolander | ............... C23C 30/005 428/698 |
| 6,183,846 B1 | * | 2/2001 | Moriguchi | .............. C23C 28/04 428/702 |
| 6,884,496 B2 | * | 4/2005 | Westphal | ................ C23C 14/58 428/698 |
| 2003/0039867 A1 | | 2/2003 | Berger et al. | |
| 2010/0215912 A1 | * | 8/2010 | Kubota | ............... C23C 14/0641 428/336 |
| 2010/0279093 A1 | | 11/2010 | Wallgram et al. | |

FOREIGN PATENT DOCUMENTS

| | | |
|---|---|---|
| CN | 1151446 A | 6/1997 |
| CN | 1334346 A | 2/2002 |
| CN | 1344595 A | 4/2002 |
| CN | 101855035 A | 10/2010 |
| CN | 101889104 A | 11/2010 |
| EP | 0 732 423 A1 | 9/1996 |
| EP | 2 208 560 A1 | 7/2010 |
| JP | 51-148713 A | 12/1976 |
| JP | 2002-355704 A | 12/2002 |
| JP | 2003-266213 A | 9/2003 |

(Continued)

OTHER PUBLICATIONS

Wiedemann et al "Structure of deposited and annealed TiB2 layers" Surf & Coat Techn. 97 (1997) p. 313-321.*

(Continued)

*Primary Examiner* — Archene Turner
(74) *Attorney, Agent, or Firm* — Venable LLP; Michael A. Sartori; Kerri M. Patterson

(57) ABSTRACT

Provided is a surface-coated cutting tool having both high wear resistance and high fracture resistance and having an indicator function that significantly facilitates the determination of the usage of a cutting edge. A surface-coated cutting tool according to an embodiment of the present invention includes a substrate and a coating formed on the substrate. The coating includes a plurality of layers. A surface layer of the plurality of layers is a titanium boride layer made of $Ti_xB_y$ (where x and y are expressed as atomic percentages and satisfy $1.5<y/x<2.5$) and has a compressive residual stress of 0.1 GPa or more in absolute value.

4 Claims, No Drawings

(56) References Cited

FOREIGN PATENT DOCUMENTS

| | | |
|---|---|---|
| JP | 2004-001215 A | 1/2004 |
| JP | 2008-238281 * | 10/2008 |
| JP | 2011-505261 A | 2/2011 |
| JP | 2012-223808 A | 11/2012 |
| KR | 10-0250587 B1 | 4/2000 |
| WO | WO-2009/047867 A1 | 4/2009 |

OTHER PUBLICATIONS

Notification of the First Office Action in Chinese Patent Application No. 201480010033.2, dated Jul. 4, 2016.
Extended European Search Report in European Patent Application No. 14754770.7, dated Aug. 22, 2016.
International Search Report in PCT International Application No. PCT/JP2014/051908 dated Mar. 11, 2014.
Notification of Second Office Action in counterpart Chinese Patent Application No. 201480010033.2, dated Jan. 4, 2017.

* cited by examiner

SURFACE-COATED CUTTING TOOL AND PROCESS FOR PRODUCING SAME

TECHNICAL FIELD

The present invention relates to surface-coated cutting tools including a substrate and a coating formed on the substrate and processes for producing such surface-coated cutting tools.

BACKGROUND ART

Steels and castings are conventionally cut using cutting tools made of materials such as cemented carbides. The inserts of these cutting tools are exposed to elevated temperatures, i.e., 800° C. or higher, during cutting. The heat generated during cutting causes problems such as plastic deformation and increased flank wear of the cutting tools.

To achieve improved cutting performance at elevated temperatures, surface-coated cutting tools including various coatings formed on substrates made of materials such as cemented carbides have been proposed. As one example, PTL 1 discloses a coated tool including a boron-containing coating formed over an aluminum oxide coating. As another example, PTL 2 discloses a cutting tool including a titanium diboride layer formed on a substrate material.

CITATION LIST

Patent Literature

PTL 1: Japanese Unexamined Patent Application Publication No. 2003-266213

PTL 2: Japanese Unexamined Patent Application Publication (Translation of PCT Application) No. 2011-505261

SUMMARY OF INVENTION

Technical Problem

These coatings are formed by chemical vapor deposition processes, such as chemical vapor deposition (CVD), and physical vapor deposition processes, such as ion plating and ion sputtering.

Among coatings formed by these processes, coatings formed by chemical vapor deposition have high adhesion strength to cemented carbide substrates and also have high wear resistance. The growing need for higher cutting speed and efficiency has resulted in a tendency to form a thicker coating; thus, the adhesion strength between the substrate and the coating is important. In view of this, it is preferred to form a coating by chemical vapor deposition.

However, if a coating is formed by chemical vapor deposition, the coating is exposed to elevated temperatures, i.e., about 1,000° C., during the deposition. As the coating is cooled to room temperature after the deposition, a tensile stress remains in the coating due to the difference in thermal expansion coefficient between the cemented carbide substrate and the coating.

If a crack occurs from the surface of the coating during cutting, the tensile stress remaining in the coating promotes propagation of the crack. Such cutting tools are insufficiently resistant to spalling of the coating and chipping.

Although a thicker coating has a higher wear resistance, more tensile stress tends to remain in the coating. This increases the frequency of abnormal tool damage and therefore decreases the fracture resistance. Thus, it is difficult to form a coating having both high wear resistance and high fracture resistance by chemical vapor deposition.

Cutting tools such as turning tools and milling tools are equipped with one or more surface-coated cutting tools. The inserts of these surface-coated cutting tools need to be replaced at the end of their lives. Whereas surface-coated cutting tools having only one cutting edge themselves need to be replaced, cutting tools having a plurality of cutting edges can be repeatedly used in different positions on the same seat surface. That is, these cutting tools can be used at different cutting positions by mounting unused cutting edges at the cutting position. Unused cutting edges can also be used by remounting the cutting edges on different seat surfaces.

In actual cutting situations, however, surface-coated cutting tools are often replaced or turned even though their cutting edges are unused. This is because, when replacing an insert or turning it for different cutting edges, the operator cannot easily determine whether the cutting edge has been used or not. Thus, the operator needs to carefully and sufficiently check the cutting edge to make sure that it has been used before the replacement procedure.

The coated tool disclosed in PTL 1 includes a colored boron-containing coating as the outermost layer of the tool so that it can be easily determined whether the tool has been used or not. This coated tool has a tensile residual stress in the boron-containing coating, which improves the adhesion between the boron-containing coating and the underlying coating and thereby improves the wear resistance. Unfortunately, as described above, such tools having a tensile residual stress in the outermost layer thereof have the problem of insufficient fracture resistance.

If the surfaces of such coated tools are subjected to mechanical processing to eliminate the tensile residual stress, the color of the outermost layer may be lost, making it difficult to determine the usage thereof.

The cutting tool disclosed in PTL 2 is not a satisfactory solution to the above problem, i.e., the difficulty in determining the usage of the tool.

If the surfaces of the tools disclosed in PTLs 1 and 2 are subjected to mechanical processing, the wear resistance of the tools may also decrease due to wear of the outermost layer.

In view of the foregoing, it is an object of the present invention to provide a surface-coated cutting tool having both high wear resistance and high fracture resistance and having an indicator function that significantly facilitates the determination of the usage of a cutting edge.

Solution to Problem

After conducting extensive research to solve the foregoing problems, the inventors have discovered that a coating composed of a plurality of layers including an outermost layer made of a particular compound can be subjected to post-processing under conditions tougher than conventionally known conditions to leave a layer that facilitates the determination of the usage thereof while improving the properties such as wear resistance. Further research based on this discovery has led to the present invention.

Specifically, a surface-coated cutting tool according to the present invention includes a substrate and a coating formed on the substrate. The coating includes a plurality of layers. A surface layer of the plurality of layers is a titanium boride layer made of $Ti_xB_y$ (where x and y are expressed as atomic percentages and satisfy $1.5<y/x<2.5$) and has a compressive residual stress of 0.1 GPa or more in absolute value.

The coating preferably includes an aluminum oxide layer made of aluminum oxide below the surface layer.

The coating preferably includes an intermediate layer between the surface layer and the aluminum oxide layer. The intermediate layer preferably includes at least one layer made of a compound of at least one element selected from the group consisting of Group 4 elements, Group 5 elements, and Group 6 elements in the periodic table, aluminum, and silicon, with at least one element selected from the group consisting of carbon, nitrogen, and oxygen.

The intermediate layer preferably includes at least one of a TiCN layer and a TiN layer. The intermediate layer may include a TiC layer.

The present invention also relates to a process for producing the surface-coated cutting tool. This process is a process for producing a surface-coated cutting tool including a substrate and a coating formed on the substrate. This process includes the steps of forming a plurality of layers on the substrate by chemical vapor deposition and applying a compressive residual stress of 0.1 GPa or more in absolute value to a surface layer of the plurality of layers by a process selected from blasting, brushing, barreling, and ion implantation. The surface layer is a titanium boride layer made of $Ti_xB_y$ (where x and y are expressed as atomic percentages and satisfy $1.5<y/x<2.5$).

Advantageous Effects of Invention

The thus-configured surface-coated cutting tool according to the present invention has the advantage of having both high wear resistance and high fracture resistance and having an indicator function that significantly facilitates the determination of the usage of a cutting edge.

DESCRIPTION OF EMBODIMENTS

Embodiments of the present invention will now be described in greater detail, although they are not intended to limit the present invention.

<Surface-Coated Cutting Tool>

A surface-coated cutting tool according to an embodiment of the present invention includes a substrate and a coating formed on the substrate. The coating is composed of a plurality of layers. The surface layer of the plurality of layers is a titanium boride layer made of $Ti_xB_y$ (where x and y are expressed as atomic percentages and satisfy $1.5<y/x<2.5$) and has a compressive residual stress of 0.1 GPa or more in absolute value.

The coating of the surface-coated cutting tool according to the present invention is formed on at least part of the rake face and the flank face. The surface layer of the coating is a titanium boride layer, which has superior properties such as high wear resistance. The titanium boride layer, which has high hardness and Young's modulus, maintains its properties, such as color, after mechanical post-processing under conditions similar to, or tougher than, conventionally known conditions and thus allows the usage of a cutting edge to be determined without difficulty.

Mechanical post-processing under conditions tougher than conventionally known conditions eliminates the tensile residual stress from the coating and applies a compressive residual stress thereto. This improves the wear resistance and fracture resistance of both the surface layer and the underlying portion of the coating and, in combination with the high hardness and Young's modulus of the surface layer, drastically improves the wear resistance and fracture resistance of the cutting tool.

The thus-configured surface-coated cutting tool according to the present invention has an indicator function that significantly facilitates the determination of the usage of a cutting edge.

The surface-coated cutting tool according to the present invention looks silver or white before use. Upon starting of cutting at a cutting edge, the cutting tool changes color in the region adjacent to the cutting edge. The cutting tool initially experiences a relatively large change in the region of the rake face adjacent to the cutting edge. The region that has changed color looks completely different from silver or white. The underlying layer, which looks much darker than the original color, is visible in that region, depending on the usage of the tool. This allows the operator to easily determine whether the tool is unused or not.

The mechanism by which the tool changes color may be due to a change in color or brightness contrast, the exposure of the underlying layer, as illustrated above, or a thermal change due to, for example, oxidation.

An example of a change in color due to oxidation is a temper color that appears due to oxidation in the region adjacent to the cutting edge as the cutting edge is heated by the heat of friction between the tool and the workpiece.

The term "change in color" as used herein also encompasses any appearance that looks as if it changed color with a build-up of substances such as chips and cutting oil.

After a short period of use, the surface-coated cutting tool according to the present invention shows the appearance as described above in the rake face and the flank face, thereby leaving a clear trace. This allows the operator to immediately determine whether the cutting edge is unused or used. As used herein, a layer that has the function of allowing the usage of the tool to be determined from a change in color or other properties (i.e., an indicator function) is also referred to as "usage-indicating layer".

The surface-coated cutting tool according to the present invention preferably has a plurality of cutting edges. As described above, the surface-coated cutting tool according to the present invention has a superior indicator function that significantly facilitates the determination of the usage of a cutting edge; thus, even if it has a plurality of cutting edges that can be used, each cutting edge is not replaced before use. This considerably simplifies tool maintenance and thus provides significantly high utility.

Examples of cutting tools include drills, end mills, indexable milling inserts, indexable turning inserts, metal saws, gear cutters, reamers, and taps.

The individual parts of the surface-coated cutting tool according to the present invention will now be described.

<Substrate>

The substrate of the surface-coated cutting tool according to the present invention may be any substrate conventionally known for use as a substrate for cutting tools. Examples of such substrates include tungsten carbide (WC)-based cemented carbides, cermets, high-speed steels, ceramics, sintered cubic boron nitride compacts, and sintered diamond compacts.

If the substrate is made of a WC-based cemented carbide, the cemented carbide preferably contains a hard phase and a binder phase. Specifically, the cemented carbide preferably contains a hard phase made of WC and a binder phase made of at least one iron group element (i.e., iron, cobalt, or nickel, also referred to as "iron group metal").

The cemented carbide may further contain, for example, a compound or solute phase and incidental impurities. The compound or solute phase is made of at least one compound of at least one element selected from the group consisting of Group 4 elements (e.g., titanium, zirconium, and hafnium), Group 5 elements (e.g., vanadium, niobium, and tantalum), and Group 6 elements (e.g., chromium, molybdenum, and tungsten) in the periodic table, with at least one element selected from the group consisting of carbon (C), nitrogen (N), oxygen (O), and boron (B). By "compound or solute phase" as used herein, it is meant that the compound forming that phase may form a solid solution or may be present as a separate compound without forming a solid solution.

An abnormal phase called free carbon locally present in the structure of the cemented carbide does not interfere with the advantages of the present invention. The cemented carbide may also have a β-free layer, a cobalt-rich layer, or a surface-hardened layer formed on the surface thereof, which does not interfere with the advantages of the present invention.

<Coating>

The coating used in the present invention is composed of a plurality of layers formed by chemical vapor deposition. The surface layer of the plurality of layers of the coating is a titanium boride layer. After the deposition, a compressive residual stress of 0.1 GPa or more in absolute value is applied to the titanium boride layer.

The coating used in the present invention has to be formed on at least part of the rake face and the flank face of the surface-coated cutting tool. The coating is preferably composed of at least three layers, and there is no upper limit to the number of layers.

The coating preferably has a thickness (if the coating is composed of two or more layers, a total thickness) of 3 to 40 µm. A coating having a thickness of less than 3 µm is insufficiently effective in improving the wear resistance. A coating having a thickness of more than 40 µm results in no further improvement in properties and is not economically advantageous. If economy is ignored, however, the coating may have a thickness of more than 40 µm, which does not interfere with the advantages of the present invention.

The thickness of the coating is measured, for example, by examining a section cut from the coated substrate (i.e., the surface-coated cutting tool) by scanning electron microscopy (SEM). The composition of the coating is measured by energy-dispersive X-ray spectroscopy (EDS). These procedures are also used to measure the thicknesses and compositions of the individual layers forming the coating.

<Titanium Boride Layer>

The titanium boride layer used in the present invention, which is formed as the surface layer of the coating, has significantly high hardness and thus can improve the wear resistance of the surface-coated cutting tool. The titanium boride layer also has a bright color such as white or silver and thus can function as a usage-indicating layer if the coating includes a layer of a different color below the titanium boride layer. This appearance also contributes to a superior design with improved commercial value.

The titanium boride layer is preferably formed on the rake face and the flank face of the tool in at least part of the region that contributes to cutting. As used herein, the term "region that contributes to cutting" refers to the cutting edge and the region around the cutting edge. As used herein, the term "region around the cutting edge" refers to the region extending about 0 to 3 mm from the cutting edge toward the center of the rake face. If the titanium boride layer is formed in this region, its high wear resistance is significantly effective during cutting, and it also clearly indicates the usage of the cutting edge so that it can be reliably determined whether the tool is unused or not.

The titanium boride forming the titanium boride layer can be represented by the chemical formula $Ti_xB_y$, where x and y are expressed as atomic percentages and have to satisfy the relationship $1.5<y/x<2.5$. Preferably, x and y satisfy the relationship $1.9<y/x<2.1$. If x and y satisfy this relationship, the titanium boride layer has a higher hardness and Young's modulus.

The titanium boride layer preferably has a thickness of 0.05 to 3 µm, more preferably 0.1 to 2 µm. A titanium boride layer having a thickness of less than 0.05 µm is undesirable since it may have insufficient wear resistance and may also impair the tool appearance when it wears partially during the application of a compressive residual stress. A titanium boride layer having a thickness of more than 3 µm is undesirable since an insufficient compressive residual stress may be applied to the underlying portion of the coating.

<Compressive Residual Stress>

The titanium boride layer used in the present invention is characterized in that a compressive residual stress is applied to the titanium boride layer by post-processing after deposition. The compressive residual stress has to be 0.1 GPa or more in absolute value.

The term "compressive residual stress" refers to an internal stress (inherent strain) present in the coating and expressed as a negative (−) value (the unit "GPa" is used herein). A larger compressive residual stress is expressed as a larger absolute value, whereas a smaller compressive residual stress is expressed as a smaller absolute value. For comparison, the term "tensile residual stress" refers to an internal stress (inherent strain) present in the coating and expressed as a positive (+) value. The term "residual stress" encompasses both compressive residual stress and tensile residual stress.

The compressive residual stress (residual stress) can be measured by the $\sin^2 \psi$ method using an X-ray stress analyzer. Specifically, the compressive residual stress can be measured by measuring the stress at any point in the layer to which a compressive residual stress has been applied in the coating (at one point, preferably two points, more preferably three to five points, even more preferably ten points (if the stress is measured at a plurality of points, it is preferred to select points separated from each other by a distance of 0.1 mm or more to measure the representative stress in that layer)) by the $\sin^2 \psi$ method and then calculating the average stress.

The X-ray $\sin^2 \psi$ method is widely used to measure residual stress in polycrystalline materials. For example, the method disclosed in detail in "X-Ray Stress Measurement" (X-Sen Oryoku Sokuteiho) (the Society of Materials Science, Japan, Yokendo, 1981), pp. 54 to 67 may be used.

The compressive residual stress can also be measured by Raman spectroscopy. Raman spectroscopy is advantageous in that the stress can be locally measured in a narrow area, for example, with a spot diameter of 1 µm. There are common methods for residual stress measurement using Raman spectroscopy are common. For example, the method disclosed in "Technology for Evaluation of Kinetic Characteristics of Thin Films" (Hakumaku No Rikigakuteki Tokusei Hyoka Gijutu) (Sipec (now renamed Realize Science & Engineering), 1992), pp. 264 to 271 can be used.

The compressive residual stress can also be measured using synchrotron radiation. This is advantageous in that the residual stress distribution can be determined across the thickness of the coating.

As described above, the compressive residual stress applied to the titanium boride layer used in the present invention after deposition is 0.1 GPa or more in absolute value. This significantly improves the toughness of the surface-coated cutting tool according to the present invention. Preferably, the compressive residual stress is 0.2 GPa or more, more preferably 0.5 GPa or more, in absolute value. A compressive residual stress of less than 0.1 GPa in absolute value may result in insufficient toughness. Although a larger compressive residual stress in absolute value is preferred to improve the toughness of the surface-coated cutting tool, a compressive residual stress of more than 10 GPa in absolute value is undesirable since the titanium boride layer may spall off.

<Underlying Layer>

The term "underlying layer" as used herein refers to the layer, either a single layer or multiple layers, formed below the surface layer of the plurality of layers formed on the substrate. Preferably, the underlying layer has a different color from the titanium boride layer and is formed over the entire surface of the substrate.

The underlying layer preferably has a thickness of 2 to 30 µm, more preferably 2 to 25 µm. An underlying layer having a thickness of less than 2 µm is undesirable since it may provide insufficient wear resistance. An underlying layer having a thickness of more than 30 µm results in no further improvement in wear resistance and is not economically advantageous. If economy is ignored, however, the underlying layer may have a thickness of more than 30 µm, which does not interfere with the advantages of the present invention.

As described above, the surface-coated cutting tool according to the present invention includes the titanium boride layer as the surface layer of the coating. This allows the coating to be subjected to mechanical post-processing under conditions tougher than conventionally known conditions to apply a compressive residual stress to both the surface layer and the underlying layer. The compressive residual stress is preferably applied to the underlying layer in at least part of the region that contributes to cutting. This is significantly effective in improving the toughness of the cutting edge and thereby preventing it from fracturing.

As used herein, the term "region that contributes to cutting" typically refers to the region extending 3 mm from the cutting edge in contact with (or adjacent to) the workpiece toward both the rake face and the flank face, depending on the shape of the tool, the type and size of the workpiece, and the mode of cutting.

Although the compressive residual stress is preferably applied over the entire region that contributes to cutting, the stress is not necessarily applied over the entire region, depending on various factors. This, however, does not interfere with the advantage described above, provided that, as described above, the compressive residual stress is applied to at least part of the region that contributes to cutting, and the stress is significantly effective in preventing the cutting edge from fracturing.

The compressive residual stress in the underlying layer is preferably 0.1 GPa or more, more preferably 0.2 GPa or more, even more preferably 0.5 GPa or more, in absolute value. A compressive residual stress of less than 0.1 GPa in absolute value may result in insufficient toughness. Although a larger compressive residual stress in absolute value is preferred to improve the toughness of the surface-coated cutting tool, a compressive residual stress of more than 10 GPa in absolute value is undesirable since spalling may occur between the layers forming the underlying layer.

Although the underlying layer may have any layer structure, it preferably includes an aluminum oxide layer made of aluminum oxide. If the underlying layer is composed of multiple layers, the aluminum oxide layer is preferably formed as the outermost layer of the multiple layers.

<Aluminum Oxide Layer>

The aluminum oxide layer, as described above, is made of aluminum oxide. The aluminum oxide layer has high wear resistance and can function as a wear-resistant layer in the coating. The wear resistance of the aluminum oxide layer, in synergy with the hardness of the titanium boride layer forming the surface layer, provides the superior advantage of drastically prolonging the tool life and allowing the cutting tool to be used in severe use environments such as high-speed cutting.

The aluminum oxide layer may have a dark color. As described above, the surface-coated cutting tool according to the present invention includes the titanium boride layer, which has a bright color such as white or silver, as the surface layer. If the underlying layer includes an aluminum oxide layer having a dark color, it provides a sharp contrast with the surface layer and thus further enhances the indicator function of the surface-coated cutting tool. To provide a sharper contrast, the aluminum oxide layer is preferably formed as the outermost layer of the underlying layer.

To be precise, the aluminum oxide layer itself does not have a dark color; it shows a color close to black due to the color of the layer formed below the aluminum oxide layer. As used herein, such appearances are also referred to as "dark" or "black".

The aluminum oxide forming the aluminum oxide layer may have any crystal structure. For example, the aluminum oxide may be α-alumina ($\alpha$-$Al_2O_3$), κ-alumina ($\kappa$-$Al_2O_3$), γ-alumina ($\gamma$-$Al_2O_3$), amorphous alumina ($Al_2O_3$), or any mixture thereof.

As used herein, the term "aluminum oxide layer made of aluminum oxide" refers to a layer containing at least aluminum oxide, i.e., in an amount of 50% by mass or more, where the balance may include other compounds such as $ZrO_2$ and $Y_2O_3$ and other elements such as chlorine (Cl), carbon (C), boron (B), and nitrogen (N). For example, an aluminum oxide layer containing other compounds such as $ZrO_2$ and $Y_2O_3$ can be considered an aluminum oxide layer to which elements such as zirconium and yttrium are added.

<Other Layers>

In addition to the aluminum oxide layer, the underlying layer used in the present invention may include, for example, layers made of compounds such as TiCN, TiN, TiCNO, TiBN, $ZrO_2$, and AlN. One preferred example of such an underlying layer is one formed by depositing a TiN layer having a thickness of several micrometers over the entire surface of the substrate, depositing a TiCN layer having a thickness of several micrometers on the TiN layer, and depositing an aluminum oxide layer having a thickness of several micrometers on the TiCN layer. Such underlying layers have high wear resistance as a whole and can function as a wear-resistant layer.

More preferably, the underlying layer used in the present invention includes a layer, below the aluminum oxide layer, made of a compound of titanium with at least one element selected from the group consisting of nitrogen (N), oxygen (O), and boron (B). This provides particularly high adhesion between the aluminum oxide layer and the layer therebelow and thus further improves the wear resistance of the surface-coated cutting tool. Examples of such compounds include TiN, TiBN, TiBNO, TiCBN, and TiCNO. Other examples of compounds that have similar effects include AlON and AlCNO.

<Intermediate Layer>

The coating used in the present invention may include an intermediate layer between the surface layer and the underlying layer. An example of such an intermediate layer is at least one layer made of a compound of at least one element selected from the group consisting of Group 4 elements, Group 5 elements, and Group 6 elements in the periodic table, aluminum, and silicon, with at least one element selected from the group consisting of carbon (C), nitrogen (N), and oxygen (O).

Examples of such compounds include TiCN, TiN, TiCNO, $TiO_2$, TiNO, TiC, TiBN, TiSiN, TiSiCN, TiAlN, TiAlCrN, TiAlSiN, TiAlSiCrN, AlCrN, AlCrCN, AlCrVN, TiAlBN, TiBCN, TiAlBCN, TiSiBCN, AlN, AlCN, $Al_2O_3$, ZrN, ZrCN, ZrN, $ZrO_2$, HfC, HfN, HfCN, NbC, NbCN, NbN, $Mo_2C$, WC, and $W_2C$. These compounds may be doped with trace amounts of other elements. The atomic ratios of these compounds follow the above general formulae.

The chemical formulae, as shown above, used to represent compounds in the present invention are not limited to their stoichiometric ratios, but encompass all conventionally known atomic ratios unless any particular atomic ratio is specified. For example, the chemical formula "TiCN" is not limited to an atomic ratio of titanium, carbon, and nitrogen of 50:25:25, and the chemical formula "TiN" is not limited to an atomic ratio of titanium to nitrogen of 50:50; they encompass all conventionally known atomic ratios.

Although the mechanism is not fully understood, the intermediate layer can improve the adhesion between the aluminum oxide layer and the titanium boride layer. The intermediate layer is preferably at least one of a TiCN layer and a TiN layer. This provides significantly high adhesion between the aluminum oxide layer and the titanium boride layer and thus imparts high wear resistance to the surface-coated cutting tool.

The intermediate layer is effective in improving the adhesion between the aluminum oxide layer and the titanium boride layer, as described above, provided that the intermediate layer is formed between the surface layer and the underlying layer. That is, the intermediate layer does not have to be formed in direct contact with the aluminum oxide layer or the titanium boride layer; for example, another layer may be formed between the intermediate layer and the aluminum oxide layer or between the intermediate layer and the titanium boride layer.

As with the surface layer and the underlying layer, the intermediate layer preferably has a compressive residual stress. The compressive residual stress in the intermediate layer is preferably 0.1 GPa or more, more preferably 0.2 GPa or more, even more preferably 0.5 GPa or more, in absolute value. A compressive residual stress of less than 0.1 GPa in absolute value may result in insufficient toughness. Although a larger compressive residual stress in absolute value is preferred to improve the toughness of the surface-coated cutting tool, a compressive residual stress of more than 10 GPa in absolute value is undesirable since spalling may occur between the intermediate layer and other layers.

<Welding Resistance>

Alternatively, the intermediate layer may be a layer that decreases the adhesion between the aluminum oxide layer and the titanium boride layer. In this case, the intermediate layer can impart welding resistance to the surface-coated cutting tool. Specifically, the intermediate layer can decrease the adhesion between the aluminum oxide layer and the titanium boride layer to allow the titanium boride layer to spall readily at the initial stage of cutting and thereby expose the aluminum oxide layer. The aluminum oxide layer has low reactivity with iron-based workpieces and therefore has high welding resistance. The aluminum oxide layer can thus be readily exposed to improve the welding resistance of the surface-coated cutting tool. An example of an intermediate layer that decreases the adhesion between the aluminum oxide layer and the titanium boride layer is a TiC layer.

<Process of Producing>

The surface-coated cutting tool according to the present invention described above can be manufactured by the following process. The surface-coated cutting tool manufactured by the following process has the advantage of having both high wear resistance and high fracture resistance and having an indicator function that significantly facilitates the determination of the usage of a cutting edge.

The process for producing the surface-coated cutting tool according to the present invention is a process for producing a surface-coated cutting tool including a substrate and a coating formed on the substrate. This process includes the steps of forming a plurality of layers on the substrate by chemical vapor deposition and applying a compressive residual stress of 0.1 GPa or more in absolute value to a surface layer of the plurality of layers by a process selected from blasting, brushing, barreling, and ion implantation. The surface layer is a titanium boride layer made of $Ti_xB_y$ (where x and y are expressed as atomic percentages and satisfy 1.5<y/x<2.5).

<Step of Forming Layers by Chemical Vapor Deposition>

The plurality of layers can be formed by conventionally known CVD processes. Preferably, at least one of the plurality of layers is deposited by medium-temperature CVD (MT-CVD). One preferred example of a layer deposited by MT-CVD is a titanium carbonitride (TiCN) layer, which has high wear resistance.

Whereas conventional CVD is performed at about 1,020° C. to 1,030° C., MT-CVD can be performed at relatively low temperatures, e.g., about 850° C. to 950° C. This results in reduced thermal damage to the substrate during the deposition. Accordingly, the layer deposited by MT-CVD is preferably formed adjacent to the substrate.

A preferred gas for use in deposition is a nitrile gas, particularly acetonitrile ($CH_3CN$), which is suitable for mass production. In some cases, a multilayer structure including a layer deposited by MT-CVD and a layer deposited by high-temperature CVD (HT-CVD) is preferred since it may improve the adhesion between the layers forming the coating.

As used herein, the term "HT-CVD" refers to conventional CVD, as described above.

<Step of Applying Compressive Residual Stress>

The process for producing the surface-coated cutting tool according to the present invention is characterized in that it includes the step of applying a compressive residual stress to the surface layer of the plurality of layers after they are formed by chemical vapor deposition and that the surface layer is a titanium boride layer. The compressive residual stress can be applied by a process selected from blasting, brushing, barreling, and ion implantation. Of these processes, mechanical processes are preferred, including brushing, blasting, and barreling.

If the compressive residual stress is applied by blasting, the abrasive used may be composed of particles commonly used for such applications. Examples of such particles include steel grits, steel shorts, cut wires, alumina, zirconia, glass beads, and silica sand. If the intermediate layer includes a layer that decreases the adhesion between the surface layer and the underlying layer (e.g., a TiC layer), the compressive residual stress is preferably applied by known brushing processes.

The compressive residual stress can also be applied to the layers other than the surface layer. In this case, suitable processes include those illustrated as processes for applying a compressive residual stress to the surface layer. The compressive residual stress can be simultaneously applied to the surface layer and the layers therebelow by adjusting the conditions.

One preferred example of the process for producing the surface-coated cutting tool according to the present invention is illustrated below. The underlying layer is first formed by depositing a TiN layer on the substrate by CVD, depositing a TiCN layer on the TiN layer by MT-CVD, and depositing an aluminum oxide layer on the TiCN layer by CVD. The intermediate layer is then formed on the underlying layer by depositing a TiCN layer by CVD. The surface layer is then formed on the intermediate layer by depositing a titanium boride layer by CVD. After the deposition, a compressive residual stress of 0.1 GPa or more is applied to the surface layer, i.e., the titanium boride layer, by blasting. A surface-coated cutting tool is thus obtained. The compressive residual stress may be simultaneously applied to the surface layer, the intermediate layer, and the underlying layer.

EXAMPLES

The present invention is further illustrated by the following examples, although they are not intended to limit the present invention. In the following description, the thicknesses of the layers of surface-coated cutting tools were measured by examining sections of the surface-coated cutting tools by SEM, as described above.

Example 1

A cemented carbide substrate having the cutting tool shape designated as CNMG120408 by JIS B 4120 (1998) in the Japanese Industrial Standards (JIS) was prepared as a substrate for a surface-coated cutting tool. This cemented carbide substrate contained 89.0% by weight WC, 8.0% by weight cobalt, and 3.0% by weight TiC.

After horning, a coating was formed over the entire surface of the substrate by CVD. Specifically, an underlying layer was first formed on the surface of the substrate by depositing, in order, a 0.5 µm thick TiN layer, a 7.0 µm thick TiCN layer (MT-CVD), and a 2.0 µm thick aluminum oxide layer made of α-alumina ($Al_2O_3$).

An intermediate layer was then formed on the underlying layer by depositing a 0.3 µm thick TiCN layer. A surface layer was then formed on the intermediate layer by depositing a 0.7 µm thick titanium boride layer made of $TiB_2$. In this way, a coating including a plurality of layers was formed on the substrate. The resulting coating is referred to as Coating No. 1.

In Coating No. 1, the TiCN layer, serving as the intermediate layer, and the titanium boride layer made of $TiB_2$, serving as the surface layer, form a usage-indicating layer. The term "TiCN layer (MT-CVD)" refers to a TiCN layer deposited by MT-CVD.

Cemented carbide substrates having Coating Nos. 2 to 7 in Table 1 formed over the entire surfaces thereof were prepared in the same manner.

TABLE 1

| Coating No. | Underlying layer | Intermediate layer | Surface layer |
|---|---|---|---|
| 1 | TiN(0.5 µm)/TiCN(7.0 µm)/α-$Al_2O_3$(2.0 µm) | TiCN(0.3 µm) | $TiB_2$(0.7 µm) |
| 2 | TiN(0.5 µm)/TiCN(7.0 µm)/κ-$Al_2O_3$(2.0 µm) | TiN(0.3 µm) | $TiB_2$(1.0 µm) |
| 3 | TiN(0.5 µm)/TiCN(7.0 µm)/α-$Al_2O_3$(2.0 µm) | TiCN(0.3 µm) | TiN(0.7 µm) |
| 4 | TiN(0.5 µm)/TiCN(7.0 µm)/α-$Al_2O_3$(2.0 µm) | None | TiN(1.0 µm) |
| 5 | TiN(0.5 µm)/TiCN(7.0 µm)/α-$Al_2O_3$(2.0 µm) | None | TiC(1.0 µm) |
| 6 | TiN(0.5 µm)/TiCN(7.0 µm)/α-$Al_2O_3$(2.0 µm) | None | None |
| 7 | TiN(0.5 µm)/TiCN(7.0 µm)/α-$Al_2O_3$(2.0 µm) | TiC(0.3 µm) | $TiB_2$(0.7 µm) |

In Table 1, all aluminum oxide layers (α-$Al_2O_3$ (2.0 µm) and κ-$Al_2O_3$ (2.0 µm)), serving as the outermost layer of the underlying layer, looked black irrespective of the type of coating. The titanium boride layers, serving as the surface layer, looked silver or white.

The coated substrates were then subjected to post-processing under the conditions shown in Table 2 to apply a compressive residual stress to the surface layer. For Post-Processing Conditions B to D, post-processing was performed by a known blasting process at the blasting pressures shown in Table 2. The blasting times for Post-Processing Conditions B to D were 5 seconds. For Post-Processing Conditions E, post-processing was performed by a known brushing process.

TABLE 2

| Post-processing conditions | Type of process | Blasting pressure (MPa) | Blasting time (sec) |
|---|---|---|---|
| A | No post-processing | — | — |
| B | Blasting | 0.10 | 5 |
| C | Blasting | 0.15 | 5 |
| D | Blasting | 0.20 | 5 |
| E | Brushing | — | — |

In this way, Surface-Coated Cutting Tool Nos. 1 to 26 were fabricated. Table 3 shows the combinations of the coatings of the surface-coated cutting tools and the post-processing conditions. In Table 3, the surface-coated cutting tools labeled with the symbol *, i.e., Nos. 3, 4, 7, 8, and 26, are surface-coated cutting tools of the Examples.

<Measurement of Residual Stress>

The residual stresses in the surface layers of Surface-Coated Cutting Tool Nos. 1 to 26 thus fabricated were measured by the $sin^2\psi$ method using an X-ray stress analyzer. The results are shown in Table 3. In the "residual stress" column in Table 3, the negative (−) values indicate compressive residual stresses, whereas the positive (+) values indicate tensile residual stresses.

<Cutting Performance Evaluation>

Surface-Coated Cutting Tool Nos. 1 to 26 were further evaluated for cutting performance by a wear resistance test and a fracture resistance test. The test conditions are shown below. The results of the evaluations are shown in Table 3.

<Wear Resistance Test Conditions>

Workpiece: SCM435 (JIS)

Cutting speed: 250 m/min.

Feed: 0.30 mm/rev.

Depth of cut 1.5 mm
Cutting oil: wet
Cutting time: 25 minutes
Evaluated for: flank wear
<Fracture Resistance Test Conditions>
 Workpiece: SCM435 (JIS), grooved
 Cutting speed: 150 m/min.
 Feed: 0.25 mm/rev.
 Depth of cut 1.5 mm
 Cutting oil: wet
 Evaluated for: time to chipping or fracturing (tool life)

includes a TiC layer as the intermediate layer, formed nearly mirror-finished surfaces on the workpieces and thus was determined to have particularly high welding resistance.

These results demonstrate that a surface-coated cutting tool including a TiC layer as the intermediate layer is preferred for reasons of welding resistance.

In contrast, the surface-coated cutting tools having part of the workpiece welded to the cutting inserts formed dull surfaces on the workpieces, and the machined surfaces were roughly finished.

TABLE 3

| Surface-coated cutting tool No. | Coating No. | Post-processing conditions | Residual stress (GPa) | Evaluations | | | | |
|---|---|---|---|---|---|---|---|---|
| | | | | Wear resistance Flank wear (mm) | Fracture resistance Tool life (min) | Determination of usage of cutting edge | Welding of workpiece to insert | Condition of machined surface of workpiece |
| 1 | 1 | A | +0.80 | 0.12 | 3.3 | Easy | Welded | Dull |
| 2 | 1 | B | −0.06 | 0.11 | 6.0 | Easy | None | Glossy |
| 3* | 1 | C | −0.22 | 0.11 | 9.6 | Easy | None | Glossy |
| 4* | 1 | D | −0.63 | 0.12 | 10.2 | Easy | None | Glossy |
| 5 | 2 | A | +0.67 | 0.14 | 2.9 | Easy | Welded | Dull |
| 6 | 2 | B | −0.08 | 0.12 | 5.8 | Easy | None | Glossy |
| 7* | 2 | C | −0.23 | 0.13 | 8.7 | Easy | None | Glossy |
| 8* | 2 | D | −0.65 | 0.14 | 9.8 | Easy | None | Glossy |
| 9 | 3 | A | +0.81 | 0.13 | 2.8 | Easy | Welded | Dull |
| 10 | 3 | B | −0.08 | 0.15 | 5.9 | Fairly difficult | None | Glossy |
| 11 | 3 | C | −0.18 | 0.18 | 8.8 | Difficult | None | Glossy |
| 12 | 3 | D | −0.40 | 0.24 | 5.0 | Difficult | None | Glossy |
| 13 | 4 | A | +0.82 | 0.14 | 2.6 | Easy | Welded | Dull |
| 14 | 4 | B | −0.07 | 0.16 | 5.7 | Fairly difficult | None | Glossy |
| 15 | 4 | C | −0.15 | 0.20 | 8.0 | Difficult | None | Glossy |
| 16 | 4 | D | −0.35 | 0.25 | 4.6 | Difficult | None | Glossy |
| 17 | 5 | A | +0.78 | 0.13 | 3.0 | Easy | None | Glossy |
| 18 | 5 | B | −0.09 | 0.18 | 5.8 | Difficult | None | Glossy |
| 19 | 5 | C | −0.18 | 0.21 | 9.0 | Difficult | None | Glossy |
| 20 | 5 | D | −0.45 | 0.27 | 4.7 | Difficult | None | Glossy |
| 21 | 6 | A | +0.65 | 0.16 | 3.2 | Difficult | None | Glossy |
| 22 | 6 | B | −0.12 | 0.19 | 5.8 | Difficult | None | Glossy |
| 23 | 6 | C | −0.19 | 0.23 | 8.9 | Difficult | None | Glossy |
| 24 | 6 | D | −0.48 | 0.28 | 5.0 | Difficult | None | Glossy |
| 25 | 7 | A | +0.70 | 0.13 | 4 | Easy | Welded | Dull |
| 26* | 7 | E | −0.12 | 0.11 | 8.9 | Easy | None | Glossy (nearly mirror-finished) |

In Table 3, a smaller flank wear indicates a higher wear resistance. The "determination of usage of cutting edge" column in Table 3 shows the results of evaluations of how easy it was to determine whether the cutting edge had been used or not. Specifically, the cutting tools subjected to the cutting tests were compared with unused cutting tools by visual inspection. Cutting tools that were clearly colored and were immediately determined to have been used were evaluated as "easy". Cutting tools that were slightly colored were evaluated as "fairly difficult". Cutting tools that were little colored after use and were not immediately determined to have been used were evaluated as "difficult".

The cutting tools subjected to the cutting tests were further evaluated for welding resistance by visually inspecting the inserts of the cutting tools and the machined surfaces of the workpieces. Cutting tools evaluated as "none" in the "welding of workpiece to insert" column and as "glossy" in the "condition of machined surface of workpiece" column in Table 3 have high welding resistance.

Of the cutting tools determined to have high welding resistance, Surface-Coated Cutting Tool No. 26, which The results in Table 3 demonstrate that the surface-coated cutting tools of the Examples, which include a substrate and a coating formed on the substrate, in which the coating includes a plurality of layers, and in which the surface layer of the plurality of layers is a titanium boride layer made of $Ti_xB_y$ (where x and y are expressed as atomic percentages and satisfy $1.5 < y/x < 2.5$) and has a compressive residual stress of 0.1 GPa or more in absolute value, have high wear resistance and fracture resistance and also have a superior indicator function that significantly facilitates the determination of the usage of a cutting edge compared to the surface-coated cutting tools of the Comparative Examples, which do not satisfy the above conditions.

Example 2

A cemented carbide substrate having the cutting tool shape designated as CNMG120408 by JIS B 4120 (1998) in the Japanese Industrial Standards (JIS) was prepared as a substrate for a surface-coated cutting tool. This cemented carbide substrate contained 90.0% by weight WC, 7.0% by weight cobalt, and 3.0% by weight TiC.

After horning, a coating was formed over the entire surface of the substrate by CVD. Specifically, an underlying layer was first formed on the surface of the substrate by depositing, in order, a 0.3 µm thick TiN layer, a 3.0 µm thick TiCN layer (MT-CVD), and a 2.0 µm thick aluminum oxide layer made of α-alumina ($Al_2O_3$).

An intermediate layer was then formed on the underlying layer by depositing a 0.2 µm thick TiCN layer. A surface layer was then formed on the intermediate layer by depositing a 0.6 µm thick titanium boride layer made of $TiB_2$. In this way, a coating including a plurality of layers was formed on the substrate. The resulting coating is referred to as Coating No. 8.

In Coating No. 8, the TiCN layer, serving as the intermediate layer, and the titanium boride layer made of $TiB_2$, serving as the surface layer, form a usage-indicating layer.

A cemented carbide substrate having Coating No. 9 in Table 4 formed over the entire surface thereof was prepared in the same manner.

TABLE 4

| Coating No. | Underlying layer | Intermediate layer | Surface layer |
|---|---|---|---|
| 8 | TiN(0.3 µm)/TiCN(3.0 µm)/α-$Al_2O_3$(2.0 µm) | TiCN(0.2 µm) | $TiB_2$(0.6 µm) |
| 9 | TiN(0.3 µm)/TiCN(3.0 µm)/α-$Al_2O_3$(2.0 µm) | TiCN(0.2 µm) | TiN(0.6 µm) |

In Table 4, all aluminum oxide layers (α-$Al_2O_3$ (2.0 µm)), serving as the outermost layer of the underlying layer, looked black irrespective of the type of coating. The titanium boride layer, serving as the surface layer, looked silver or white.

The coated substrates were then subjected to post-processing by a known blasting process for the blasting times shown in Table 5 to apply a compressive residual stress to the surface layer. All processes were performed at a blasting pressure of 0.15 MPa.

TABLE 5

| Post-processing conditions | Type of process | Blasting pressure (MPa) | Blasting time (sec) |
|---|---|---|---|
| F | No post-processing | — | — |
| G | Blasting | 0.15 | 5 |
| H | Blasting | 0.15 | 10 |
| I | Blasting | 0.15 | 15 |

In this way, Surface-Coated Cutting Tool Nos. 27 to 34 were fabricated. Table 6 shows the combinations of the coatings of the surface-coated cutting tools and the post-processing conditions. In Table 6, the surface-coated cutting tools labeled with the symbol *, i.e., Nos. 29 and 30, are surface-coated cutting tools of the Examples.

<Measurement of Residual Stress>

The residual stresses in the surface layers of Surface-Coated Cutting Tool Nos. 27 to 34 were measured by the $\sin^2\psi$ method using an X-ray stress analyzer. The results are shown in Table 6. In the "residual stress" column in Table 6, the negative (−) values indicate compressive residual stresses, whereas the positive (+) values indicate tensile residual stresses.

<Cutting Performance Evaluation>

Surface-Coated Cutting Tool Nos. 27 to 34 were further evaluated for cutting performance by a wear resistance test and a fracture resistance test. The test conditions are shown below. The results of the evaluations are shown in Table 6.

<Wear Resistance Test Conditions>
Workpiece: SUS304 (JIS)
Cutting speed: 150 m/min.
Feed: 0.20 mm/rev.
Depth of cut 1.5 mm
Cutting oil: wet
Cutting time: 25 minutes
Evaluated for: flank wear <Fracture Resistance Test Conditions>
Workpiece: SUS304 (JIS), grooved
Cutting speed: 100 m/min.
Feed: 0.25 mm/rev.
Depth of cut 1.5 mm
Cutting oil: wet
Evaluated for: time to chipping or fracturing (tool life)

TABLE 6

| Surface-coated cutting tool No. | Coating No. | Post-processing conditions | Residual stress (GPa) | Wear resistance Flank wear (mm) | Fracture resistance Tool life (min) | Determination of usage of cutting edge |
|---|---|---|---|---|---|---|
| 27 | 8 | F | +0.58 | 0.15 | 2.3 | Easy |
| 28 | 8 | G | −0.08 | 0.14 | 5.5 | Easy |
| 29* | 8 | H | −0.25 | 0.15 | 7.8 | Easy |
| 30* | 8 | I | −0.63 | 0.15 | 9.3 | Easy |
| 31 | 9 | F | +0.64 | 0.17 | 1.9 | Easy |
| 32 | 9 | G | −0.06 | 0.18 | 5.0 | Fairly difficult |
| 33 | 9 | H | −0.21 | 0.20 | 7.2 | Difficult |
| 34 | 9 | I | −0.54 | 0.26 | 1.7 | Difficult |

In Table 6, a smaller flank wear indicates a higher wear resistance. The "determination of usage of cutting edge" column in Table 6 shows the results of evaluations of how easy it was to determine whether the cutting edge had been used or not. Specifically, the cutting tools subjected to the cutting tests were compared with unused cutting tools by visual inspection. Cutting tools that were clearly colored and were immediately determined to have been used were evaluated as "easy". Cutting tools that were slightly colored were evaluated as "fairly difficult". Cutting tools that were little colored after use and were not immediately determined to have been used were evaluated as "difficult".

The results in Table 6 demonstrate that the surface-coated cutting tools of the Examples, which include a substrate and a coating formed on the substrate, in which the coating includes a plurality of layers, and in which the surface layer of the plurality of layers is a titanium boride layer made of $Ti_xB_y$ (where x and y are expressed as atomic percentages and satisfy $1.5<y/x<2.5$) and has a compressive residual stress of 0.1 GPa or more in absolute value, have high wear resistance and fracture resistance and also have a superior indicator function that significantly facilitates the determination of the usage of a cutting edge compared to the surface-coated cutting tools of the Comparative Examples, which do not satisfy the above conditions.

Whereas embodiments and examples of the present invention have been described above, combinations of these embodiments and examples are also contemplated.

The embodiments and examples disclosed herein are to be considered in all respects as illustrative and not restrictive. The scope of the present invention is indicated by the appended claims, rather than by the foregoing description, and all changes that come within the meaning and range of equivalency of the claims are intended to be embraced therein.

The invention claimed is:

1. A surface-coated cutting tool comprising a substrate and a coating formed on the substrate, wherein
the coating comprises a plurality of layers, and
a surface layer of the plurality of layers is a titanium boride layer comprising $Ti_xB_y$ (where x and y are expressed as atomic percentages and satisfy $1.5<y/x<2.5$) and has a compressive residual stress of 0.1 GPa or more in absolute value, wherein
an aluminum oxide layer comprising at least one selected from α-alumina, κ-alumina, γ-alumina, or amorphous alumina disposed below the surface layer,
the coating comprises an intermediate layer between the surface layer and the aluminum oxide layer,
the intermediate layer comprises at least one layer comprising a compound of at least one element selected from the group consisting of Group 4 elements, Group 5 elements, and Group 6 elements in the periodic table, aluminum, and silicon, with at least one element selected from the group consisting of carbon, nitrogen, and oxygen, and
the aluminum oxide layer and the intermediate layer have a compressive residual stress of 0.1 GPa or more in absolute value.

2. The surface-coated cutting tool according to claim 1, wherein the intermediate layer comprises at least one of a TiCN layer and a TiN layer.

3. The surface-coated cutting tool according to claim 1, wherein the intermediate layer comprises a TiC layer.

4. A process for producing a surface-coated cutting tool comprising a substrate and a coating formed on the substrate, the process comprising the steps of:
forming a plurality of layers on the substrate by chemical vapor deposition; and
applying a compressive residual stress of 0.1 GPa or more in absolute value to a surface layer of the plurality of layers by a process selected from blasting, brushing, barreling, and ion implantation, wherein
the surface layer is a titanium boride layer comprising $Ti_xB_y$ (where x and y are expressed as atomic percentages and satisfy $1.5<y/x<2.5$),
an aluminum oxide layer comprising at least one selected from α-alumina, κ-alumina, γ-alumina, or amorphous alumina is disposed below the surface layer,
the coating comprises an intermediate layer between the surface layer and the aluminum oxide layer,
the intermediate layer comprises at least one layer comprising a compound of at least one element selected from the group consisting of Group 4 elements, Group 5 elements, and Group 6 elements in the periodic table, aluminum, and silicon, with at least one element selected from the group consisting of carbon, nitrogen, and oxygen, and
the aluminum oxide layer and the intermediate layer have a compressive residual stress of 0.1 GPa or more in absolute value.

* * * * *